(12) United States Patent
Deak et al.

(10) Patent No.: US 10,168,396 B2
(45) Date of Patent: Jan. 1, 2019

(54) LOW FLY HEIGHT IN-PLANE MAGNETIC IMAGE SENSOR CHIP

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 102 days.

(21) Appl. No.: 15/304,956

(22) PCT Filed: Apr. 14, 2015

(86) PCT No.: PCT/CN2015/076530
§ 371 (c)(1),
(2) Date: Oct. 18, 2016

(87) PCT Pub. No.: WO2015/158247
PCT Pub. Date: Oct. 22, 2015

(65) Prior Publication Data
US 2017/0184690 A1 Jun. 29, 2017

(30) Foreign Application Priority Data
Apr. 18, 2014 (CN) .......................... 2014 1 0156470

(51) Int. Cl.
*G01R 33/09* (2006.01)
*G01R 33/00* (2006.01)
(Continued)

(52) U.S. Cl.
CPC .......... *G01R 33/091* (2013.01); *G01R 33/00* (2013.01); *G01R 33/0052* (2013.01); *G07D 7/04* (2013.01); *H01L 43/08* (2013.01); *H01L 43/12* (2013.01)

(58) Field of Classification Search
CPC .......... G01R 33/20; G01V 3/32; A61B 5/055; G01N 24/00
(Continued)

(56) References Cited

U.S. PATENT DOCUMENTS

| 5,644,228 A | 7/1997 | Jeffers et al. |
| 2013/0225975 A1* | 8/2013 | Harvey ................. A61B 5/0037 600/411 |
| 2013/0225978 A1* | 8/2013 | Remmele .............. A61M 16/01 600/420 |
| 2015/0190659 A1* | 7/2015 | Kohler ..................... A61N 7/02 600/411 |

(Continued)

FOREIGN PATENT DOCUMENTS

| CN | 101937063 | 1/2011 |
| CN | 102288927 | 12/2011 |

(Continued)

OTHER PUBLICATIONS

"International Application No. PCT/CN2015/076530, International Search Report and Written Opinion dated Jul. 8, 2015", (Jul. 8, 2015), 10 pgs.

*Primary Examiner* — Giovanni Astacio-Oquendo
(74) *Attorney, Agent, or Firm* — Schwegman Lundberg & Woessner, P.A.

(57) ABSTRACT

Disclosed is a low fly height in-plane magnetic image sensor chip. This sensor chip comprises a silicon (Si) substrate with a pit on the surface, a magnetoresistive sensor, and an insulating layer. The magnetoresistive sensor is located on the bottom surface of the pit in the Si substrate. The insulating layer is located above the magnetoresistive sensor. The magnetic image surface detected during operation is coplanar or parallel with the surface of the Si substrate surface. The input and output ends of the magnetoresistive sensor are connected with leads directly, or bonded with (Continued)

leads through pads, or through a conducting post and pads to form connections. And the flying height of the leads is lower than the height of the surface of the Si substrate. This technical solution has several advantages, such as compact structure, high output signal, and direct contact with the magnetic image.

20 Claims, 5 Drawing Sheets

(51) Int. Cl.
  *G07D 7/04* (2016.01)
  *H01L 43/08* (2006.01)
  *H01L 43/12* (2006.01)
(58) Field of Classification Search
  USPC ........ 324/252, 307, 311, 300, 200, 301, 309
  See application file for complete search history.

(56) References Cited

U.S. PATENT DOCUMENTS

| | | | |
|---|---|---|---|
| 2015/0260808 A1* | 9/2015 | Katscher | G01R 33/4833 |
| | | | 324/309 |
| 2017/0234945 A1* | 8/2017 | Findeklee | G01R 33/288 |
| | | | 324/313 |
| 2017/0319097 A1* | 11/2017 | Amthor | A61B 5/055 |

FOREIGN PATENT DOCUMENTS

| | | |
|---|---|---|
| CN | 102621188 | 8/2012 |
| CN | 102841325 | 12/2012 |
| CN | 103942872 | 7/2014 |
| WO | WO-2015/158247 | 10/2015 |

* cited by examiner

LOW FLY HEIGHT IN-PLANE MAGNETIC IMAGE SENSOR CHIP

PRIORITY CLAIM TO RELATED APPLICATIONS

This application is a U.S. national stage application filed under 35 U.S.C. § 371 from International Application Serial No. PCT/CN2015/076530, which was filed 14 Apr. 2015, and published as WO2015/158247 on 22 Oct. 2015, and which claims priority to Chinese Application No. 201410156470.7, filed 18 Apr. 2014, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a low fly height in-plane magnetic image sensor chip.

BACKGROUND ART

A magnetic image identification sensor is mainly used in the field of finance, for example, in a POS, an ATM, a currency detector, a money counting machine and so on. A magnetic strip of a credit card is made of a hard magnetic material, a magnetic field thereof can be measured directly, a surface image of a banknote is printed by ink containing soft magnetic particles, and the magnetic particles are magnetized, upon application of a bias magnetic field, to be detected by the magnetic image identification sensor, achieving identification of information of the credit card or the image of the banknote. The magnetic image identification sensor generally adopts an audio magnetic head technology or a magnetoresistive head technology. The audio magnetic head uses a coil to wind a ring-like structure with a gap, which uses the principle of electromagnetic induction to induce an induction current in the coil according to a magnetic flux change generated when the gap rapidly passes through the magnetic particles, and establish distribution signals of magnetic images according to changes to the induction current. Main problems existing in the technology are as follows: 1. the magnetic field sensitivity is low, and only with a method of increasing the number of turns can an effective signal be obtained; 2. the size is large, the size resolution is low, rapid movement is required, and there is no response to static magnetic field signals; and 3. the power consumption is high. The magnetoresistive head implements detection on a magnetic field by using a Hall, an AMR, a GMR or a Hall effect sensor chip, but for the chips, a magnetic sensor slice is generally packaged in a polymer material and then used for detecting a magnetic image. Moreover, during design, an input/output port of a magnetoresistive sensor on the magnetic sensor slice is generally in the front, and is bonded with leads. As a result, the following problems mainly exist: 1) in the presence of bonding with leads and 2) in the presence of a package material, the fly height of the lead or the package material exists between the surface of a magnetic sensor and a magnetic image detection plane, which increases the operating distance between the magnetic image and the magnetic sensor, such that an output signal of the sensor is reduced, and meanwhile, it is required that a permanent magnet assembly provides a larger bias magnetic field.

SUMMARY OF THE INVENTION

Directed to the problems existing in the magnetoresistive sensor chip, the present invention discloses a low fly height in-plane magnetic image sensor chip, for detecting a magnetic image, including: a silicon (Si) substrate with a pit on the surface, a magnetoresistive sensor, and an insulating layer, the magnetoresistive sensor being located on the bottom surface of the pit in the Si substrate, the insulating layer being located above the magnetoresistive sensor, the insulating layer being provided with a window corresponding to input and output ends of the magnetoresistive sensor, the input and output ends of the magnetoresistive sensor being connected with leads directly, or bonded with leads through pads, or through a conducting post and pads to form connections at the window, the conducting post connecting the input and output ends of the magnetoresistive sensor and the pads, the pads being located on the input and output ends of the magnetoresistive sensor or the conducting post, the plane where the magnetic image is located being a magnetic image detection plane, and the direction of the magnetic image moving in the magnetic image detection plane relative to the working magnetoresistive sensor being a scanning direction, wherein, the fly height of the leads is lower than the height of the surface of the Si substrate, and the magnetic image detection plane is parallel or coplanar with the surface of the Si substrate.

Preferably, a bottom plane of the pit is parallel with the surface of the Si substrate.

Preferably, the magnetoresistive sensor is one of Hall, AMR, GMR or TMR magnetoresistive sensors.

Preferably, the insulating layer is aluminum oxide, silicon nitride, silicon oxide, photoresist, polyimide or benzocyclobutene.

Preferably, the surface of the Si substrate is higher than the upper surface of the magnetoresistive sensor by 1-10 um.

Preferably, the magnetic image sensor chip further includes a PCB, and the input and output ends of the magnetoresistive sensor or the pads are bonded to the PCB with leads to form connections.

Preferably, the magnetic field sensitive direction of the magnetoresistive sensor is parallel/perpendicular to the magnetic image detection plane, and when the magnetic field sensitive direction of the magnetoresistive sensor is parallel to the magnetic image detection plane, the magnetic field sensitive direction is parallel/perpendicular to the scanning direction.

Preferably, the magnetic image sensor chip further includes a permanent magnet assembly, and the magnetic field sensitive direction of the magnetoresistive sensor is parallel to the scanning direction.

Preferably, the permanent magnet assembly is a concave permanent magnet, and the surface of the concave permanent magnet provided with a groove directly faces the back of the PCB, the grooving direction is parallel to the magnetic image detection plane and perpendicular to the magnetic field sensitive direction, and the magnetization direction of the concave permanent magnet is perpendicular to the direction of the PCB.

Preferably, the permanent magnet assembly includes two permanent magnets having the same magnetization direction, wherein the two permanent magnets are symmetrically located at two sides of the PCB along the scanning direction respectively, and the magnetization direction thereof is perpendicular to the front of the PCB.

Preferably, the permanent magnet assembly includes one back permanent magnet located at the back of the PCB and two side permanent magnets disposed symmetrically at two sides of the PCB along the scanning direction, wherein magnetization directions of the back permanent magnet and the two side permanent magnets are both perpendicular to the magnetic image detection plane, and the magnetization direction of the back permanent magnet is opposite to the magnetization direction of the two side permanent magnets.

Preferably, the magnetoresistive sensor is of a half-bridge structure including two, three or four magnetic sensitive units arranged into two rows and one column, three rows and one column or two rows and two columns, and magnetic field sensitive directions of the magnetic sensitive units are identical; the two magnetic sensitive units have the same resistance and directly constitute a half bridge; the resistance of the magnetic sensitive unit located in the middle row among the three magnetic sensitive units is half of the resistance of each of the two magnetic sensitive units located in two side rows, and the two magnetic sensitive units located in two side rows are connected in parallel to form a half-bridge structure with the magnetic sensitive unit located in the middle row; the four sensitive units have the same resistance, two magnetic sensitive units in the same row are connected in parallel, the two rows are connected in series to form a half-bridge structure, and the column direction thereof is parallel to the scanning direction.

Preferably, the magnetoresistive sensor is of a full-bridge structure including four magnetic sensitive units, the magnetic sensitive units have identical magnetic field sensitive directions and are arranged into two rows and two columns, two magnetic sensitive units included in two half bridges constituting the full bridge are located in two rows but in different columns respectively, and column directions thereof are parallel to the scanning direction.

Preferably, the full-bridge or half-bridge structure is a single low fly height in-plane magnetic image sensor chip integrated with multiple magnetic sensitive units, or an interconnected combination of multiple discrete elements each integrated with one or more low fly height in-plane magnetic image sensor chips.

The present invention further provides a micro-manufacturing method of a low fly height in-plane magnetic image sensor chip, where the micro-manufacturing method includes the following steps:

(1) forming a pit on the surface of a Si substrate by DRIE or a wet etching process, and flattening the bottom of the pit;

(2) depositing a magnetoresistive material thin film at the bottom of the pit, and patterning the magnetoresistive material thin film to form a magnetoresistive sensor;

(3) depositing an insulating layer above the magnetoresistive sensor, and forming a window of input and output ends of the magnetoresistive sensor on the insulating layer; and (4) flattening the insulating layer.

Preferably, a pad is formed in the window of the input and output ends of the magnetoresistive sensor.

Preferably, a conducting post is deposited and shaped in the window of the input and output ends of the magnetoresistive sensor, a pad is formed on the conducting post, the conducting post passes through the insulating layer, and the pad is located above the insulating layer.

Preferably, the step (2) includes: depositing a bottom conducting layer at the bottom of the pit, and patterning the bottom conducting layer; depositing a magnetic tunnel junction layer on the bottom conducting layer, and patterning the magnetic tunnel junction layer to form a magnetic tunnel junction element and a non-magnetic tunnel junction element; depositing a second insulating layer on the magnetic tunnel junction layer, and flattening to expose the magnetic tunnel junction layer; depositing a top conducting layer above the second insulating layer and the magnetic tunnel junction layer, and patterning the top conducting layer.

Preferably, the input and output ends of the magnetoresistive sensor are located on the top conducting layer above the non-magnetic tunnel junction element, and the non-magnetic tunnel junction element is connected to a magnetic tunnel junction element in the adjacent magnetoresistive sensor by the bottom conducting layer or the top conducting layer.

Preferably, the second insulating layer comprises aluminum oxide, silicon nitride, silicon oxide, photoresist, polyimide, or benzocyclobutene.

The present invention has the following beneficial effects: the structure is impact, package is unnecessary, direct contact with a magnetic image is possible, and an output signal is strong.

BRIEF DESCRIPTION OF THE DRAWINGS

To describe the technical solutions in the technologies in embodiments of the present invention more clearly, accompanying drawings to be used in the technologies in the embodiments are introduced below briefly. Apparently, the accompanying drawings described in the following are only some embodiments of the present invention, and those of ordinary skill in the art can further obtain other accompanying drawings according to the accompanying drawings without any creative work.

DETAILED DESCRIPTION OF EMBODIMENTS

The present invention will be described below in detail with reference to the accompanying drawings and in combination with embodiments.

Embodiment 1

Figure 1:
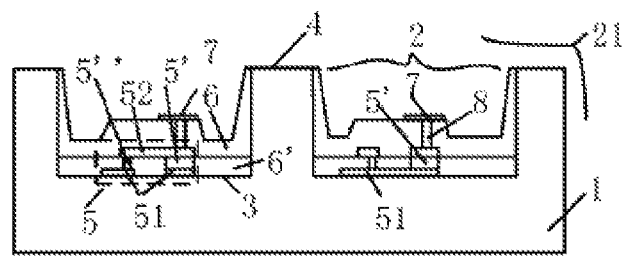
FIG. 1 is a first structural diagram of a low fly height in-plane magnetic image sensor chip.
Figure 2:
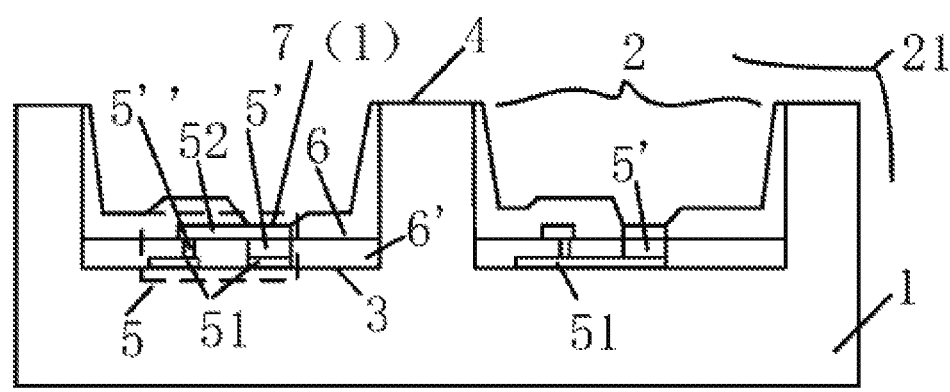
FIG. 2 is a second structural diagram of the low fly height in-plane magnetic image sensor chip.
Figure 3:
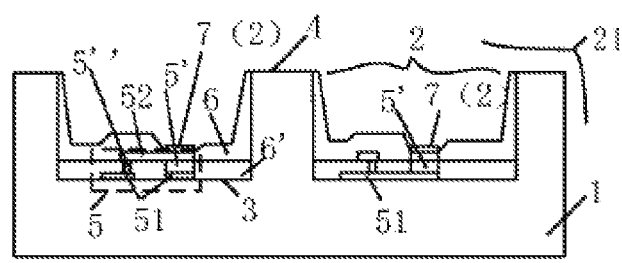
FIG. 3 is a third structural diagram of the low fly height in-plane magnetic image sensor chip.

FIG. 1 to FIG. 3 are three different types of structural diagrams of a low fly height in-plane magnetic image sensor chip 21. The low fly height in-plane magnetic image sensor chip 21 includes a Si substrate 1 with a pit 2 on the surface 4, a magnetoresistive sensor 5 and an insulating layer 6. The bottom surface 3 of the pit 2 is parallel to the surface 4 of the Si substrate 1, the magnetoresistive sensor 5 is located on the bottom surface 3 of the pit 2 in the Si substrate 1, the surface 4 of the Si substrate 1 is higher than the upper surface of the magnetoresistive sensor 5 by 1-10 um, the insulating layer 6 is located above the magnetoresistive sensor 5, and a window is formed on the insulating layer 6 corresponding to input and output ends of the magnetoresistive sensor 5. The input and output ends of the magnetoresistive sensor 5 are bonded with leads in various forms. In FIG. 1, a pad 7 is connected to the input and output ends of the magnetoresistive sensor 5 through a conducting post 8, the pad 7 is located above the insulating layer 6, and the conducting post 8 passes through the insulating layer 6. In FIG. 2, there is no pad, and the leads are directly bonded to a portion 7(1) of the input and output ends of the magnetoresistive sensor 5 at the window. In FIG. 3, a pad 7(2) is directly located on an electrode of the input and output ends of the magnetoresistive sensor 2, and the leads are bonded to the pad 7(2). In FIG. 2 and FIG. 3, the electrodes of the input and output ends of the magnetoresistive sensor 5 are located at a window opening position of the insulating layer 6. A key feature of the low fly height magnetic image sensor chip 21 lies in that, as the magnetoresistive sensor 5 is located on the bottom surface 3 of the pit 2, when the chip 21 forms connections with the PCB or other chips in the form of lead bonding, the lead fly height thereof may be lower than the height of the surface 4 of the Si substrate 1, such that the detected magnetic image may be directly located on the surface of the chip 21, that is, the surface 4 of the Si substrate 1, thus shortening the distance between the magnetoresistive sensor 5 and the magnetic image. Moreover, packaging materials such as polymers are not needed, thus obtaining the strongest output signal.

The magnetoresistive sensor 5 may be one of Hall, AMR, GMR or TMR. If the magnetoresistive sensor 5 is a TMR sensor, as shown in FIG. 1 to FIG. 3, it includes a bottom conducting layer 51, a magnetic tunnel junction layer above the bottom conducting layer 51, a second insulating layer 6' located on the magnetic tunnel junction layer and capable of exposing the magnetic tunnel junction layer, and a top conducting layer 52 above the second insulating layer 6' and the exposed magnetic tunnel junction layer. The magnetic tunnel junction layer is patterned to form a magnetic tunnel junction element and a non-magnetic tunnel junction element, input and output ends of the TMR sensor are located on the top conducting layer 52 on the non-magnetic tunnel junction element, and the non-magnetic tunnel junction element is connected to a magnetic tunnel junction element in an adjacent magnetoresistive sensor by the top conducting layer 52 or the bottom conducting layer 51. Moreover, the magnetic tunnel junction layers 5' and 5" and the bottom conducting layer 51 are located in the second insulating layer 6', surfaces of the magnetic tunnel junction layers 5' and 5" are exposed from the second insulating layer 6' and contact the top conducting layer 52. At this point, the conducting post 8 and the pad 7 are as shown in FIG. 1, a lead bonding position 7(1) is as shown in FIG. 2, and the pad 7(2) is as shown in FIG. 3.

The insulating layers 6 and 6' are made of aluminum oxide, silicon nitride, silicon oxide or photoresist, polyimide, benzocyclobutene.

Embodiment 2

Figure 4:
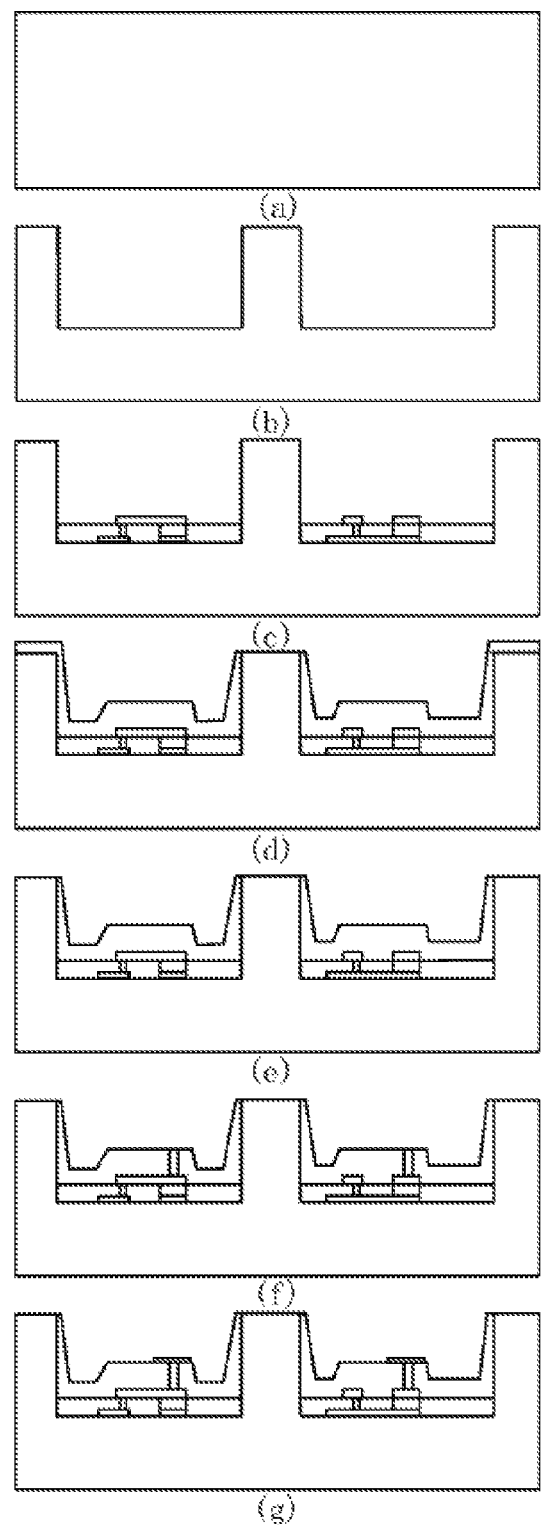
FIG. 4 is a first micro-machining diagram of the low fly height in-plane magnetic image sensor chip.
Figure 5:
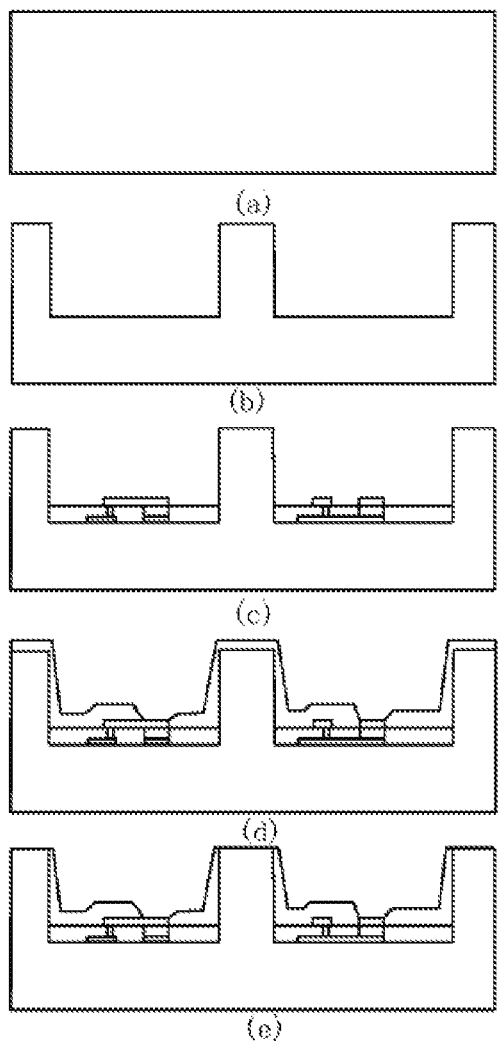
FIG. 5 is a second micro-machining diagram of the low fly height in-plane magnetic image sensor chip.

FIG. 4 to FIG. 5 are process diagrams of micro-machining of three types of low fly height in-plane magnetic image sensor chips 21 corresponding to FIG. 1 to FIG. 3, wherein, the micro-machining process corresponding to FIG. 4 includes the following steps: a) preparing a Si substrate 1; b) forming a pit 2 on the surface 4 of the Si substrate 1 by DRIE or a wet etching process, and flattening the bottom of the pit 2; c) depositing and patterning a magnetoresistive sensor 5 at the bottom of the pit 2, the magnetoresistive sensor 5 being formed by depositing a magnetoresistive thin film material; d) depositing an insulating layer 6 above the magnetoresistive sensor 5, and forming a window corresponding to input and output ends of the magnetoresistive sensor 5; e) flattening the insulating layer 6; f) depositing and shaping a conducting post 8 at the window, the conducting post 8 passing through the insulating layer 6; and g) shaping a pad 7 on the conducting post 8.

The micro-machining process corresponding to FIG. 5 includes the following steps: a) preparing a Si substrate 1; b) forming a pit 2 on the surface 4 of the Si substrate 1 by DRIE or a wet etching process, and flattening the bottom of the pit 2; c) depositing and patterning a magnetoresistive sensor 5 at the bottom of the pit 2; d) depositing an insulating layer 6 above the magnetoresistive sensor 5, and opening a window for input and output ends of the magnetoresistive sensor 5; and e) flattening the insulating layer 6.

Figure 6:
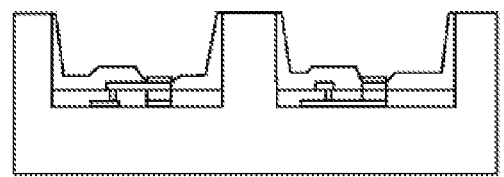
FIG. 6 is a third micro-machining diagram of the low fly height in-plane magnetic image sensor chip.

On the basis of the technology of FIG. 5, a step of shaping a pad 7(2) at the window of the input and output ends of the magnetoresistive sensor 5 is added to the process corresponding to FIG. 6.

When the magnetoresistive sensor is a TMR sensor, the micro-machining step c) is divided into four steps: 1. depositing a bottom conducting layer 51 at the bottom of the pit 2, and patterning the bottom conducting layer 51; 2. depositing a magnetic tunnel junction layer on the bottom conducting layer 51, patterning the magnetic tunnel junction layer, and forming a magnetic tunnel junction element and a non-magnetic tunnel junction element; 3. depositing a second insulating layer 6' on the magnetic tunnel junction layer and flattening to expose the tunnel junction layer; and 4. depositing and patterning a top conducting layer 52 on the second insulating layer 6' and the magnetic tunnel junction layer.

Embodiment 3

Figure 7:
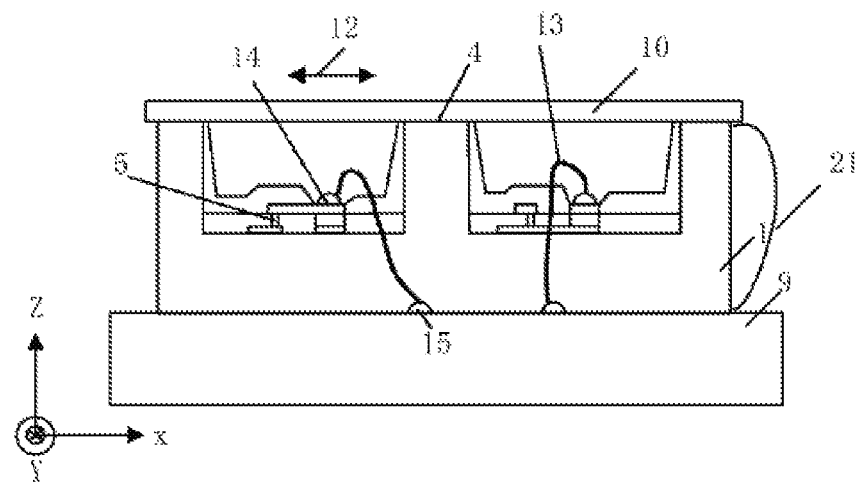
FIG. 7 is a mounting diagram of the low fly height in-plane magnetic image sensor chip and a PCB.

FIG. 7 is a schematic diagram of a POS machine magnetic head without a permanent magnet assembly to which a low fly height in-plane magnetic image sensor chip 21 is applied, wherein the low fly height in-plane magnetic image sensor chip 21 is located on a PCB 9, and at this point, a pad 7 on the low fly height in-plane magnetic image sensor chip 21 and the PCB 9 are bonded with leads, wherein 14 and 15 indicate solder balls on the pad 7 and the PCB 9, respectively. A magnetic image 10 is directly located on a magnetic image detection plane formed on the surface 4 of the Si substrate 1 of the low fly height in-plane magnetic sensor chip 21. In addition, the magnetic image detection plane may be kept to be parallel to the surface 4 of the Si substrate 1, and the scanning direction 12 thereof is parallel to the magnetic image detection plane. At this point, the sensing direction of the magnetoresistive sensor 5 is one of three directions, i.e., X, Y and Z. That is, the magnetic field sensitive direction of the magnetoresistive sensor 5 is parallel/perpendicular to the magnetic image detection plane, and when the magnetic field sensitive direction of the magnetoresistive sensor 5 is parallel to the magnetic image detection plane, the magnetic field sensitive direction is parallel/perpendicular to the scanning direction 12. As the magnetic image 10 detected by the POS machine magnetic head is made of a hard magnetic material and generates a magnetic field itself, no bias magnetic field is needed. When the magnetic image 10 is formed by a hard magnet, a magnetic field generated thereby may act on the low fly height in-plane magnetic image sensor chip 21, and magnetic field distribution features thereof along the scanning direction 12 are converted into electrical signals, thereby implementing reading of the magnetic image 10. It should be noted that, to facilitate illustration, FIG. 7 merely provides a situation in which the low fly height in-plane magnetic image sensor chip 21 shown in FIG. 2 is combined with the PCB 9, and this solution is also applicable to the low fly height in-plane magnetic image sensor chip 21 shown in FIG. 1 and FIG. 3.

Embodiment 4

Figure 8:
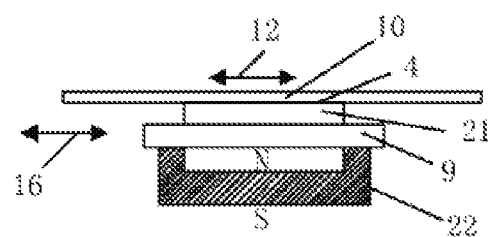
FIG. 8 is a first application diagram of a permanent magnet assembly in the low fly height in-plane magnetic image sensor chip.
Figure 9:
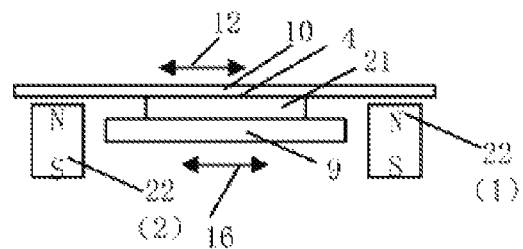
FIG. 9 is a second application diagram of the permanent magnet assembly in the low fly height in-plane magnetic image sensor chip.
Figure 10:
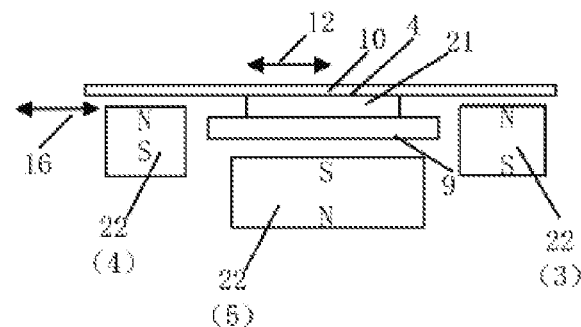
FIG. 10 is a third application diagram of the permanent magnet assembly in the low fly height in-plane magnetic image sensor chip.

FIG. 8 to FIG. 10 are schematic diagrams of a low fly height in-plane magnetic image sensor chip 21 applied to, for example, a currency detector including a permanent magnet assembly and used for soft magnetic image detection. In this case, the chip 21 further includes a permanent magnet assembly 22 and a PCB board 9. In the presence of the permanent magnet assembly 22, the magnetic field sensitive direction 16 of the low fly height in-plane magnetic image sensor chip 21 is consistent with the scanning direction 12, and is parallel to the magnetic image detection plane. Likewise, the magnetic image 10 may be directly located on the surface 4 of a Si substrate 1, and may also be kept in parallel to the surface but not in contact therewith.

The permanent magnet assembly 22 shown in FIG. 8 is a concave permanent magnet, a geometric structure thereof is that an upper surface of a block is provided with a rectangular groove, the upper surface of the concave permanent magnet is in contact with the back of the PCB board 9 directly, the magnetization direction thereof is perpendicular to the PCB board 9, and the grooving direction of the rectangular groove is perpendicular to the scanning direction 12 and parallel to the magnetic image detection plane 4.

The permanent magnet assembly 22 of FIG. 9 includes two permanent magnets 22(1) and 22(2), the two permanent magnets 22(1) and 22(2) are located symmetrically at two sides of the low fly height in-plane magnetic image sensor chip 21 along the scanning direction 12, respectively, magnetization directions thereof are perpendicular to the magnetic image detection plane 4, and the magnetization directions thereof are the same.

The permanent magnet assembly 22 of FIG. 10 includes three permanent magnets 22(3), 22(4) and 22(5). The permanent magnets 22(3) and 22(4) are located symmetrically at two sides of the low fly height in-plane magnetic image sensor chip 21 along the scanning direction 12, referred to as side permanent magnets, and magnetization directions thereof are the same and are perpendicular to the magnetic image detection plane. The permanent magnet 22(5) is located right below the PCB 9, that is, at the back of the PCB 9, referred to as a back permanent magnet, and the magnetization direction thereof is anti-parallel to those of the permanent magnets 22(3) and 22(4).

Embodiment 5

Figure 11:
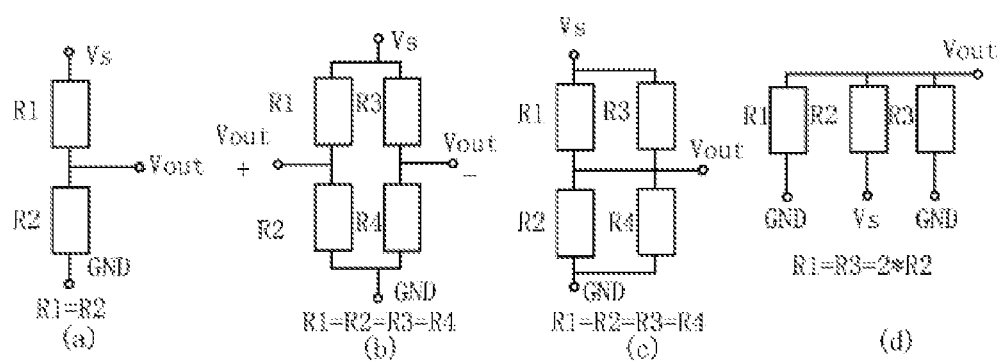
FIG. 11 is a structural diagram of a magnetoresistive sensor: (a) a half bridge; (b) a full bridge; (c) a dual-half bridge; (d) a three-magnetoresistive units half bridge.

FIG. 11 is a structural diagram of a magnetoresistive sensor 5 on a low fly height in-plane magnetic image sensor chip 21. FIG. 11(a) is a half-bridge structure including two sensitive units R1 and R2 arranged into two rows and one column, and the two magnetic sensitive units R1 and R2 have the same resistance and directly constitute a half bridge. FIG. 11(b) is a full-bridge structure including four sensitive units R1, R2, R3 and R4 arranged into two rows and two columns, and having two outputs Vout+ and Vout−, wherein two sensitive units included in two half bridges constituting the full bridge are located in two rows but different columns, respectively. FIG. 11(c) is a half-bridge structure including four sensitive units R1, R3, R2 and R4 arranged in two rows and two columns, wherein two magnetic sensitive units in the same row are connected in parallel, then two rows are connected in series to form a half-bridge structure, and the two half bridges R1, R2 and R3, R4 share a power source and a ground, respectively, but have a common output end. FIG. 11(d) is a three-sensing element half-bridge structure including three sensitive units R1, R2 and R3 arranged in three rows and one column, wherein the sensitive units R1 and R3 at two side rows have the same resistance, the resistance thereof is twice that of the sensitive unit R2 in the middle row, R1 and R3 are connected in parallel and then connected to the R2 in series to form a half bridge, and an output signal voltage is output from a middle common end of R1, R2 and R3. In the various arrangement structures, magnetic field sensitive directions of the magnetic sensitive units are identical, and column directions are parallel to the scanning direction 12. The magnetoresistive sensitive unit may be one of TMR, Hall, AMR, GMR units.

Figure 12:
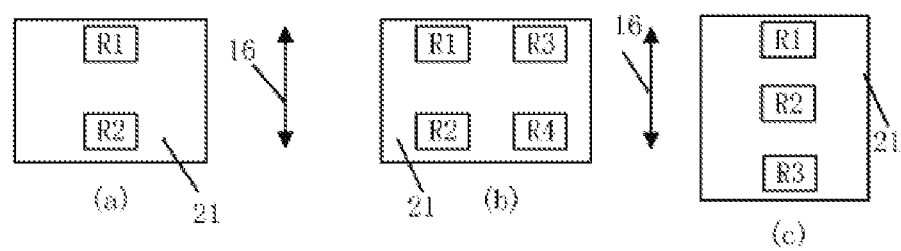
FIG. 12 is an arrangement diagram of sensitive elements in a magnetoresistive sensor: a) a half-bridge structure; b) a full-bridge structure or a dual half-bridge structure; c) a three-elements half-bridge structure.

FIG. 12 is an arrangement diagram of sensitive units of the magnetoresistive sensor 5 on the low fly height in-plane magnetic image sensor chip 21. FIG. 12(a) is a half-bridge structure including two sensitive units R1 and R2, wherein the arrangement direction thereof is parallel to the sensing direction 16. FIG. 12(b) is a four-sensitive unit full-bridge structure, in which sensitive units R1 and R2 are corresponding to one bridge arm, sensitive units R3 and R4 are corresponding to the other bridge arm, and the sensitive units R1, R2 and R3, R4 are arranged along the sensing direction 16. FIG. 12(c) is a three-sensitive unit half-bridge structure, in which sensitive units R1, R2 and R3 are arranged in rows along the sensing direction 16, the sensitive unit R2 is located between the sensitive units R1 and R3, and the magnetic field sensitive direction of the sensitive units R1-R3 is 16.

It should be noted that, the full-bridge or half-bridge structure magnetoresistive sensor chip may be a single low fly height magnetic image sensor chip integrated with multiple sensitive units, and may also be replaced by multiple low fly height magnetic image sensor chip discrete elements. For the latter, the discrete low fly height magnetic image sensor chips are integrated into one or more sensitive units, and the discrete low fly height magnetic image sensor chips are interconnected to form a half-bridge or full-bridge structure.

The above descriptions are merely preferred embodiments of the present invention, and are not intended to limit the present invention. For those skilled in the art, the present invention may have various modifications and changes. Any modification, equivalent replacement, improvement and the like without departing from the spirit and principle of the present invention should all fall within the protection scope of the present invention.

The invention claimed is:

1. A low fly height in-plane magnetic image sensor chip for detecting a magnetic image, comprising:
    a silicon (Si) substrate with a pit on a surface of the Si substrate,
    a magnetoresistive sensor, and
    an insulating layer,
    wherein the magnetoresistive sensor is located on the bottom surface of the pit in the Si substrate, the insulating layer is located above the magnetoresistive sensor, and the insulating layer is provided with a window corresponding to input and output ends of the magnetoresistive sensor,
    wherein the input and output ends of the magnetoresistive sensor are connected with leads directly, or bonded with leads through pads, or through a conducting post and pads to form connections at the window,
    wherein the conducting post connects the input and output ends of the magnetoresistive sensor and the pads located on the input and output ends of the magnetoresistive sensor or the conducting post,
    wherein the plane where the magnetic image is located is a magnetic image detection plane, and the direction of the magnetic image moving in the magnetic image detection plane when working relative to the magnetoresistive sensor is a scanning direction, wherein the fly height of the leads is lower than the height of the surface of the Si substrate, and the magnetic image detection plane is parallel or coplanar with the surface of the Si substrate.

2. The low fly height in-plane magnetic image sensor chip according to claim 1, wherein a bottom plane of the pit is parallel with the surface of the Si substrate.

3. The low fly height in-plane magnetic image sensor chip according to claim 1, wherein the magnetoresistive sensor is one of Hall, AMR, GMR or TMR magnetoresistive sensors.

4. The low fly height in-plane magnetic image sensor chip according to claim 1, wherein the insulating layer is aluminum oxide, silicon nitride, silicon oxide, photoresist, polyimide or benzocyclobutene.

5. The low fly height in-plane magnetic image sensor chip according to claim 1, wherein the surface of the Si substrate is higher than the upper surface of the magnetoresistive sensor by 1-10 um.

6. The low fly height in-plane magnetic image sensor chip according to claim 1, wherein the magnetic image sensor chip further comprises a PCB, and the input and output ends of the magnetoresistive sensor or the pads are bonded to the PCB with leads to form connections.

7. The low fly height in-plane magnetic image sensor chip according to claim 6, wherein the magnetic image sensor chip further comprises a permanent magnet assembly, and the magnetic field sensitive direction of the magnetoresistive sensor is parallel to the scanning direction.

8. The low fly height in-plane magnetic image sensor chip according to claim 7, wherein the permanent magnet assembly is a concave permanent magnet, and a surface of the concave permanent magnet provided with a groove directly faces the back of the PCB, the grooving direction is parallel to the magnetic image detection plane and perpendicular to the magnetic field sensitive direction, and the magnetization direction of the concave permanent magnet is perpendicular to the direction of the PCB.

9. The low fly height in-plane magnetic image sensor chip according to claim 7, wherein the permanent magnet assembly comprises two permanent magnets having the same magnetization direction, wherein the two permanent magnets are symmetrically located at two sides of the PCB along the scanning direction respectively, and the magnetization direction thereof is perpendicular to the front of the PCB.

10. The low fly height in-plane magnetic image sensor chip according to claim 7, wherein the permanent magnet assembly comprises one back permanent magnet located at the back of the PCB and two side permanent magnets disposed symmetrically at two sides of the PCB along the scanning direction, wherein magnetization directions of the back permanent magnet and the two side permanent magnets are both perpendicular to the magnetic image detection plane, and the magnetization direction of the back permanent magnet is opposite to the magnetization direction of the two side permanent magnets.

11. The low fly height in-plane magnetic image sensor chip according to claim 1, wherein the magnetic field sensitive direction of the magnetoresistive sensor is parallel/perpendicular to the magnetic image detection plane, and when the magnetic field sensitive direction of the magnetoresistive sensor is parallel to the magnetic image detection plane, the magnetic field sensitive direction is parallel/perpendicular to the scanning direction.

12. The low fly height in-plane magnetic image sensor chip according to claim 1, wherein the magnetoresistive sensor is of a half-bridge structure comprising two, three or four magnetic sensitive units arranged into two rows and one column, three rows and one column or two rows and two columns, and magnetic field sensitive directions of the magnetic sensitive units are identical; the two magnetic sensitive units have the same resistance and directly constitute a half bridge; the resistance of the magnetic sensitive unit located in the middle row among the three magnetic sensitive units is half of the resistance of each of the two magnetic sensitive units located in two side rows, and the two magnetic sensitive units located in two side rows are connected in parallel to form a half-bridge structure with the magnetic sensitive unit located in the middle row; the four sensitive units have the same resistance, two magnetic sensitive units in the same row are connected in parallel, the two rows are connected in series to form a half-bridge structure, and the column direction thereof is parallel to the scanning direction.

13. The low fly height in-plane magnetic image sensor chip according to claim 12, wherein the full-bridge or half-bridge structure is a single low fly height in-plane magnetic image sensor chip integrated with multiple magnetic sensitive units, or a combination of multiple discrete elements each integrated with one or more low fly height in-plane magnetic image sensor chips.

14. The low fly height in-plane magnetic image sensor chip according to claim 1, wherein the magnetoresistive sensor is of a full-bridge structure comprising four magnetic sensitive units, the magnetic sensitive units have identical magnetic field sensitive directions and are arranged into two rows and two columns, two magnetic sensitive units comprised in the two half bridges constituting the full bridge are located in two rows but in different columns respectively, and column directions thereof are parallel to the scanning direction.

15. A micro-manufacturing method of a low fly height in-plane magnetic image sensor chip, wherein the micro-manufacturing method comprises:

forming a pit on a surface of a silicon substrate by DRIE or a wet etching process, and flattening the bottom of the pit;

depositing a magnetoresistive material thin film at the bottom of the pit, and patterning the magnetoresistive material thin film to form a magnetoresistive sensor;

depositing an insulating layer above the magnetoresistive sensor, and forming a window of input and output ends of the magnetoresistive sensor on the insulating layer; and flattening the insulating layer.

16. The micro-manufacturing method of a low fly height in-plane magnetic image sensor chip according to claim 15, wherein a pad is formed in the window of the input and output ends of the magnetoresistive sensor.

17. The micro-manufacturing method of a low fly height in-plane magnetic image sensor chip according to claim 15, wherein a conducting post is deposited and shaped in the window of the input and output ends of the magnetoresistive sensor, a pad is formed on the conducting post, the conducting post passes through the insulating layer, and the pad is located above the insulating layer.

18. The micro-manufacturing method of a low fly height in-plane magnetic image sensor chip according to claim 15, wherein the step (2) comprises:

depositing a bottom conducting layer at the bottom of the pit, and patterning the bottom conducting layer;

depositing a magnetic tunnel junction layer on the bottom conducting layer, and patterning the magnetic tunnel junction layer to form a magnetic tunnel junction element and a non-magnetic tunnel junction element;

depositing a second insulating layer on the magnetic tunnel junction layer, and flattening to expose the magnetic tunnel junction layer; and depositing a top conducting layer above the second insulating layer and the magnetic tunnel junction layer, and patterning the top conducting layer.

19. The micro-manufacturing method of a low fly height in-plane magnetic image sensor chip according to claim 18, wherein the input and output ends of the magnetoresistive sensor are located on the top conducting layer above the non-magnetic tunnel junction element, and the non-magnetic tunnel junction element is connected to a magnetic tunnel junction element in the adjacent magnetoresistive sensor by the bottom conducting layer or the top conducting layer.

20. The micro-manufacturing method of a low fly height in-plane magnetic image sensor chip according to claim 18, wherein the second insulating layer comprises aluminum oxide, silicon nitride, silicon oxide, photoresist, polyimide, or benzocyclobutene.

* * * * *